US012218678B2

(12) United States Patent
Ravinuthula

(10) Patent No.: US 12,218,678 B2
(45) Date of Patent: Feb. 4, 2025

(54) SELF CALIBRATION FOR AN ANALOG-TO-DIGITAL CONVERTER

(71) Applicant: TEXAS INSTRUMENTS INCORPORATED, Dallas, TX (US)

(72) Inventor: Vishnu Ravinuthula, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 255 days.

(21) Appl. No.: 17/900,445

(22) Filed: Aug. 31, 2022

(65) Prior Publication Data

US 2024/0072818 A1 Feb. 29, 2024

(51) Int. Cl.
*H03M 1/10* (2006.01)
*H03M 1/00* (2006.01)
*H03M 1/06* (2006.01)
*H03M 1/16* (2006.01)

(52) U.S. Cl.
CPC .......... *H03M 1/1023* (2013.01); *H03M 1/001* (2013.01); *H03M 1/06* (2013.01); *H03M 1/1009* (2013.01); *H03M 1/167* (2013.01)

(58) Field of Classification Search
CPC .. H03M 1/1023; H03M 1/1009; H03M 1/001; H03M 1/06; H03M 1/167
See application file for complete search history.

(56) References Cited

U.S. PATENT DOCUMENTS 5,012,181 A * 4/1991 Eccleston ............ G01R 35/005
341/120

* cited by examiner

*Primary Examiner* — Joseph J Lauture
(74) *Attorney, Agent, or Firm* — Charles F. Koch; Frank D. Cimino

(57) ABSTRACT

A method for calibrating analog-to-digital conversion includes converting, by an analog-to-digital converter (ADC), a first input voltage to a first digital code. The first input voltage is generated from a reference voltage used as a reference voltage by the ADC. The method includes converting, by the ADC, a second input voltage to a second digital code. The second input voltage is generated from the reference voltage used as the reference voltage by the ADC. The method also includes calculating a calibration factor based on the first digital code, the second digital code, the first input voltage, and the second input voltage, converting, by the ADC, a third voltage to a third digital code, and correcting the third digital code using the calibration factor.

20 Claims, 3 Drawing Sheets

SELF CALIBRATION FOR AN ANALOG-TO-DIGITAL CONVERTER

BACKGROUND

Many applications include an analog-to-digital converter (ADC) to convert an analog voltage to a digital code for further processing by, for example, a microcontroller. For example, an electric vehicle may have a battery monitor that includes circuitry to convert the vehicle's battery voltage to a digital code. The circuitry may include an analog front-end and the ADC. The signal path from the battery through the analog front-end and the ADC may have gain and offset errors. Such gain and offset errors may reduce the accuracy of the digital code output by the ADC.

SUMMARY

In one embodiment, a method for calibrating analog-to-digital conversion includes converting, by an analog-to-digital converter (ADC), a first input voltage to a first digital code. The first input voltage is generated from a reference voltage used by the ADC. The method includes converting, by the ADC, a second input voltage to a second digital code. The second input voltage is generated from the reference voltage used by the ADC. The method also includes calculating a calibration factor based on the first digital code, the second digital code, the first input voltage, and the second input voltage, converting, by the ADC, a third voltage to a third digital code, and correcting the third digital code using the calibration factor.

In another embodiment, an electrical circuit includes a resistor divider network coupled between a first terminal and a second terminal. The resistor divider network has a first resistor divider output and a second resistor divider output. An analog-to-digital converter (ADC) has an analog input configured to receive first and second input voltages from the first and second resistor divider outputs, respectively. The ADC has a reference voltage input coupled to the first terminal. A microcontroller is configured to: receive, from the ADC, a first digital code corresponding to a first input voltage from the first resistor divider output, receive, from the ADC, a second digital code corresponding to a second input voltage from the second resistor divider output, calculate a correction factor based on the first digital code, the second digital code, the first input voltage, and the second input voltage, receive a third digital code from the ADC, and correct the third digital code using the correction factor.

DETAILED DESCRIPTION

Figure 1:
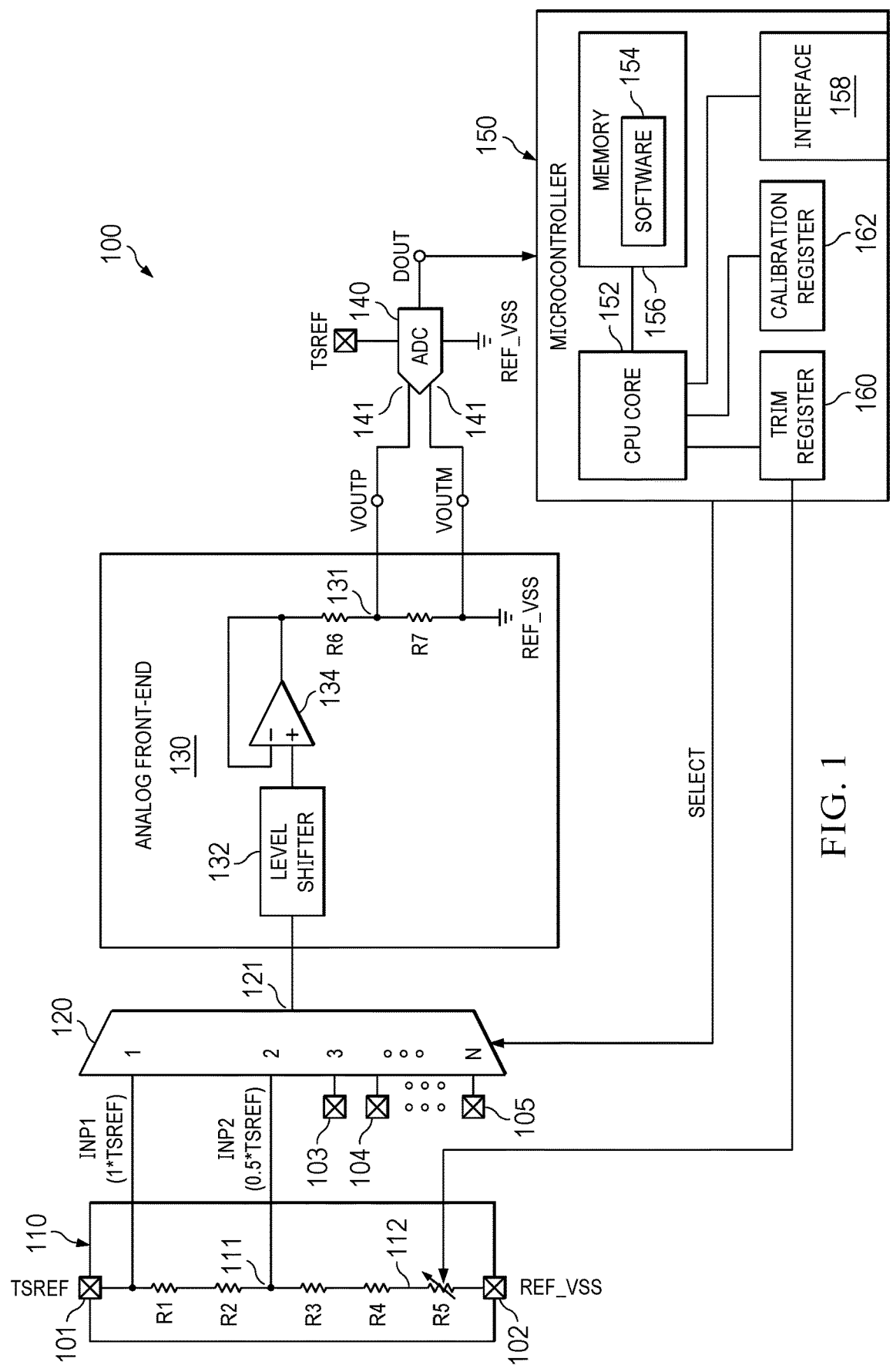
FIG. 1 is a schematic diagram of an analog-to-digital conversion circuit that includes a self-calibration capability, in accordance with an example.

The same reference numbers or other reference designators are used in the drawings to designate the same or similar (either by function and/or structure) features.

FIG. 1 is a schematic diagram of an analog-to-digital conversion system 100, in accordance with an illustrative embodiment. In this example, the analog-to-digital conversion system 100 includes a resistor divider network 110, an analog multiplexer 120, an analog front-end (AFE) 130, an ADC 140, and a microcontroller 150. In some embodiments, the components shown in FIG. 1 may be fabricated as an integrated circuit on a common semiconductor die. In other embodiments, some of the components may be fabricated on different dies.

The resistor divider network 110 includes resistors R1, R2, R3, R4, and R5 coupled in series between a reference voltage (TSREF) terminal 101 and a reference ground (REF_VSS) terminal 102. Terminals 101 and 102 are externally-accessible terminals of the die on which the resistor divider network 110 is fabricated. The die may be mounted on a printed circuit board (PCB), and the reference voltage TSREF and the reference ground REF_VSS) may be provided to the terminals 101 and 102, respectively, via components and connections external to the die on which the resistor divider network 110 is fabricated.

In one embodiment, the resistances of resistors R1-R4 are nominally equal to each other (e.g., 100 KΩ). That being the case, then the voltage on the node 111 between resistors R2 and R3 will be one-half of the voltage difference between TSREF and REF_VSS. Taking REF_VSS as a ground reference and assuming resistors R1-R4 have equal resistances, the voltage on node 111 is (0.5*TSREF).

Due to manufacturing tolerances, resistors R1-R4 may not all be of equal resistance. Resistor R5 is a trimmable resistor used to substantially correct for any deviations of the resistances of resistors R1-R4 from their nominal values. In one embodiment, digital trim codes from the microcontroller 150 can be adjust the resistance of resistor R5. A mid-level trim code (e.g., digital "4" for a 3-bit trim code) results in a particular resistance for resistor R5. A larger or smaller trim code will result in a larger or smaller resistance for resistance R5.

The analog multiplexer 120 has multiple inputs 1, 2, 3, ... n. Terminal 101 is coupled to input 1 of the multiplexer 120. Node 111 is coupled to input 2 of the multiplexer 120. The analog voltages on inputs 1 and 2 of the multiplexer are (1*(TSREF−REF_VSS)) and (0.5*(TSREF−REF_VSS)), respectively. The die containing the multiplexer 120 includes additional terminals 103, 104, and 105 to which analog voltages can be coupled for conversion to digital codes by the ADC 140. Terminals 103, 104, and 105 are coupled to corresponding inputs of the multiplexer 120. In one example, the voltages on terminals 103-105 may be voltages within one or more battery modules of an electric vehicle. Although three terminals 103-105 are shown coupled to the multiplexer 120, fewer than three (1 or 2) or more than 3 terminals can be included to provide analog voltages to the multiplexer 120. An analog voltage may be provided to any of the terminals 103-105 and thus to an input of the multiplexer. A selection signal (SELECT) is generated by the microcontroller and coupled to a selection control input of the multiplexer. SELECT may be a multi-bit value that encodes the multiplexer input whose analog voltage is to be provided on the multiplexer's output 121.

The multiplexer output 121 is coupled to the AFE 130. Any suitable configuration for an AFE can be provided. In the example of FIG. 1, AFE 130 includes a voltage level shifter 132, an operational-amplifier (OP AMP) 134, and resistors R6 and R7. The output 121 of the multiplexer 120 is coupled to an input of the level shifter 132. The level shifter 132 shifts the voltage level of the output signal from the multiplexer 120 either up or down as desired. In one example, the level shifter 132 is a 1-volt level shifter, which increases the voltage level of the multiplexer's output signal by 1 volt. The inverting (−, negative) input of OP AMP 134 is coupled to the output of OP AMP 134, and the output of the level shifter 132 is coupled to the positive (+, non-inverting) input of OP AMP 134. The OP AMP 134 is thus configured as a unity gain buffer, whose output voltage is approximately equal to the output voltage from the level shifter 132. Resistors R6 and R7 are coupled in series between the output of OP AMP 134 and REF_VSS. In one example, the resistances of resistors R6 and R7 are equal (e.g., 100 KΩ) and thus the voltage (VOUTP) on node 131 (relative to REF_VSS) between resistors R6 and R7 is approximately one-half of the voltage on the output of OP AMP 134.

The voltage across resistor R7 is (VOUTP−VOUTM) and is coupled to the input 141 of the ADC 140. The ADC 140 can be implemented in a variety of ways. Example ADC architectures include successive approximation register (SAR) ADCs, flash conversion ADCs, sigma-delta ADCs (discrete time or continuous time), etc. The reference voltage TSREF and the ground reference REF_VSS are coupled to the ADC 140 as the positive and negative reference voltages used by the ADC during its analog-to-digital conversion process. Thus, the reference voltages TSREF and REF_VSS used by the ADC 140 is also coupled to the resistor divider network 110. The ADC 140 converts its analog input voltage (VOUTP−VOUTM) to a digital code, DOUT. The number of bits of the digital code may be any suitable number of bits (e.g., 3 bits, 8 bits, 10 bits, etc.). Each DOUT code produced by the ADC 140 may be stored in a register within the ADC and read by the microcontroller 150.

Microcontroller 150 includes a central processing unit (CPU) core 152 (or multiple CPU cores), memory 154, an interface 158, and registers 160 and 162. The memory 154 may be a non-transitory memory such as a non-volatile memory (e.g., a read-only memory). Memory 154 stores software 156, which can be read and executed by CPU core 152. The interface 158 may be a serial interface such as the Inter-Integrated Circuit (I2C) interface, or another suitable interface. The interface can be used by external circuitry (external to the die containing the microcontroller 150) to provide configuration parameters to the microcontroller. In one example, a trim value can be stored in register 160 (referred to herein as a "trim register"). The trim value includes one or more bits that are used to trim resistor R5.

Resistor R5 may include multiple resistors and transistors configured as switches. The trim value may turn ON and OFF certain transistors to configure the resistance of resistor R5 between nodes 112 and 102. In one embodiment, during power-up or a reset event for the microcontroller 150, the CPU core 152 executes software 156 to read the trim value from the trim register 160 and configure the trim resistor R5 accordingly.

Register 162 may be used to store one or more calibration values and is referred to herein as the "calibration register." The calibration values are computed by the CPU core 152 executing software 156 as described below.

The signal path from the voltage input (e.g., terminals 103-105) to the output of the ADC 140 has gain and offset errors. For example, the AFE 130 may have gain and offset errors. Gain errors may result from deviations of the resistances of resistors R6 and R7 from their nominal values due to manufacturing tolerances, temperature, etc. Offset errors may result from offset within the OP AMP 134. Further, the ADC 140 may have its own gain and offset errors irrespective of the type of ADC.

The voltage on terminal 101 is TSREF and is coupled to input 1 of multiplexer 120. The voltage on node 111 is (0.5*TSREF) and is coupled to input 2 of multiplexer 120. These voltages are input voltages INP1 and INP2, respectively, for use in calibrating the analog-to-digital conversion system 100. Input voltages INP1 and INP2 are generated based on TSREF and REF_VSS, which are the reference voltages used by the ADC 130. Because INP1 and IPN2 are generated based on the same reference voltages used by ADC 130, INP1 and INP2 will inherently track any deviations in TSREF and REF_VSS. For example, if the ADC positive reference voltage, TSREF, shifts due to packaging or soldering stress, input voltages INP1 and INP2 will automatically be adjusted based on TSREF. The calibration process described herein is a two-point calibration process using INP1 and INP2.

Figure 2:
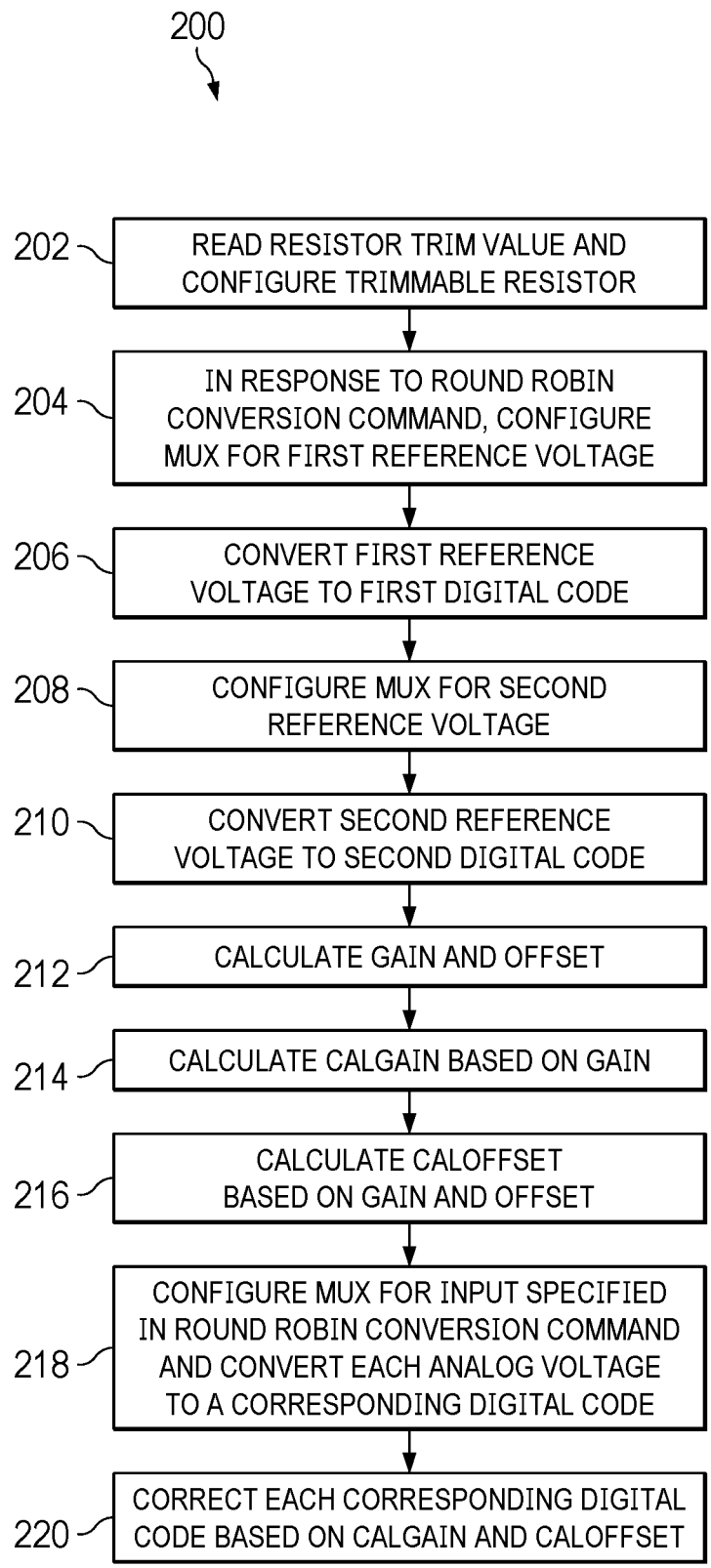
FIG. 2 is a flow chart of a method for calibrating the analog-to-digital conversion circuit, in accordance with an example.

FIG. 2 is a flowchart illustrating a calibration method in accordance with an embodiment. References to an operation performed by the microcontroller 150 mean being performed by, for example, the CPU core 152 executing software 156 within the microcontroller. The flowchart of FIG. 2 is now described with reference to FIG. 1. At step 202, the method includes reading the trim value from trim register 160 and using the trim value to configure the trimmable resistor R5. Step 202 may be performed by the CPU core 152 executing software 156 upon a power-on or reset event of the microcontroller 150.

In one embodiment, the analog-to-digital conversion system 100 can be configured to perform a "round-robin" conversion process in which analog voltages on one or more of the multiplexer inputs 1-$n$ are sequentially converted to corresponding digital codes. The sequence of the conversion may start with INP1, proceed to INP2, and then proceed through multiplexer inputs 3-$n$. An external device (e.g., a microprocessor) may send a round-robin conversion command to the microcontroller 150 via interface 158. In one example, the command may specify which of the multiplexer inputs 3 through n are to be included in the round-robin analog-to-digital conversion process.

In response to receiving the round-robin conversion command, at step 204, the microcontroller 150 configures multiplexer 120 to provide INP1 on its output. The microcontroller 150 outputs a SELECT signal (multiple bits) that specify to the multiplexer that its input 1 (INP1) is to be provided as its output voltage. The analog voltage INP1 is provided through multiplexer 120 to the AFE 130, and the output voltage from the AFE (VOUTP−VOUTM) is converted into a first digital code (DOUT1) by the ADC 140, as indicated by step 206. The digital code equivalent of INP1 (as processed through AFE 130) is provided to the microcontroller 150 (e.g., the microcontroller may read DOUT from an output register within the ADC 140). At step 208, the microcontroller 150 configures multiplexer 120 to provided INP2 on its output, and at step 210, INP2 is converted to a second digital code (DOUT2).

At step 212, the microcontroller 212 calculates values of GAIN and OFFSET. In one embodiment, GAIN and OFFSET are calculated as:

$$\text{GAIN} = \frac{(DOUT1 - DOUT2)}{(INP1 - INP2)} \quad (1)$$

$$\text{OFFSET} = DOUT1 - (INP1 * \text{GAIN}) \quad (2)$$

In an X-Y graph with the digital codes (DOUT1 and DOUT2) on the Y axis and the analog voltages (INP1 and INP2) on the X axis, GAIN represents the slope of a line connecting the X,Y points (INP1, DOUT1) and (INP2, DOUT2), and OFFSET represents the Y intercept of that line. Although DOUT1 and INP1 are used in Eq. (2), DOUT2 and INP2 can alternatively be used as desired to calculate OFFSET.

At step 214, calibration factor CALGAIN is calculated by the microcontroller based on GAIN. In one example, $$CALGAIN = \frac{1}{GAIN} \quad (3)$$

At 216, another calibration factor CALOFFSET is calculated by the microcontroller 150 based on OFFSET and GAIN. In one example, $$CALOFFSET = \frac{OFFSET}{GAIN} \quad (4)$$

Because OFFSET is calculated based on at least one of DOUT1 or DOUT2, CALOFFSET is also calculated based on at least one of DOUT1 or DOUT2.

The calibration factors CALGAIN and CALOFFSET are then used to correct digital codes produced by the ADC 140 based on the analog inputs 3-n from the multiplexer 120. At step 218, the microcontroller 150 configures the multiplexer 120 to sequence through each of its inputs 3-n (e.g., as specified in the round-robin command) to a corresponding digital code. At step 220, the microcontroller 150 corrects each such digital code (from step 218) based on the calibration factors CALGAIN and CALOFFSET. In one example, Eq. (5) below is calculated by the microcontroller 150 to correct each digital code:

DOUTX_CORR=(DOUTX*CALGAIN)−CALOFFSET (5)

where DOUTX is the digital code for input X (X is one of inputs 3 through n of the multiplexer) and DOUTX_CORR is the corrected version of DOUTX.

In one embodiment, the conversion of INP1 and INP2 to DOUT1 and DOUT2 and their use in determining CALGAIN and CALOFFSET is performed each time a round-robin conversion process is performed. Accordingly, the analog-to-digital conversion system 100 produces calibration factors that dynamically change as temperature changes and during the life of the system 100. In other embodiments, the calibration process to use INP1 and INP2 to calculate CALGAIN and CALOFFSET may be performed less frequently than for every round-robin conversion (e.g., every other round-robin conversion, every third round-robin conversion, once every hour, etc.).

In one embodiment, the microcontroller 150 configures the multiplexer 120 to digitize INP1 and INP2, then calculate CALGAIN and CALOFFSET, and then read and correct each uncorrected digital code from the ADC 140. In another embodiment, the microcontroller 150 reads the digital codes corresponding to INP1, INP2, and the analog voltages from terminals 103-105, then calculates CALGAIN and CALOFFSET based on the digital codes for INP1 and INP2, and then corrects the uncorrected digital codes read from the ADC 140.

Figure 3:
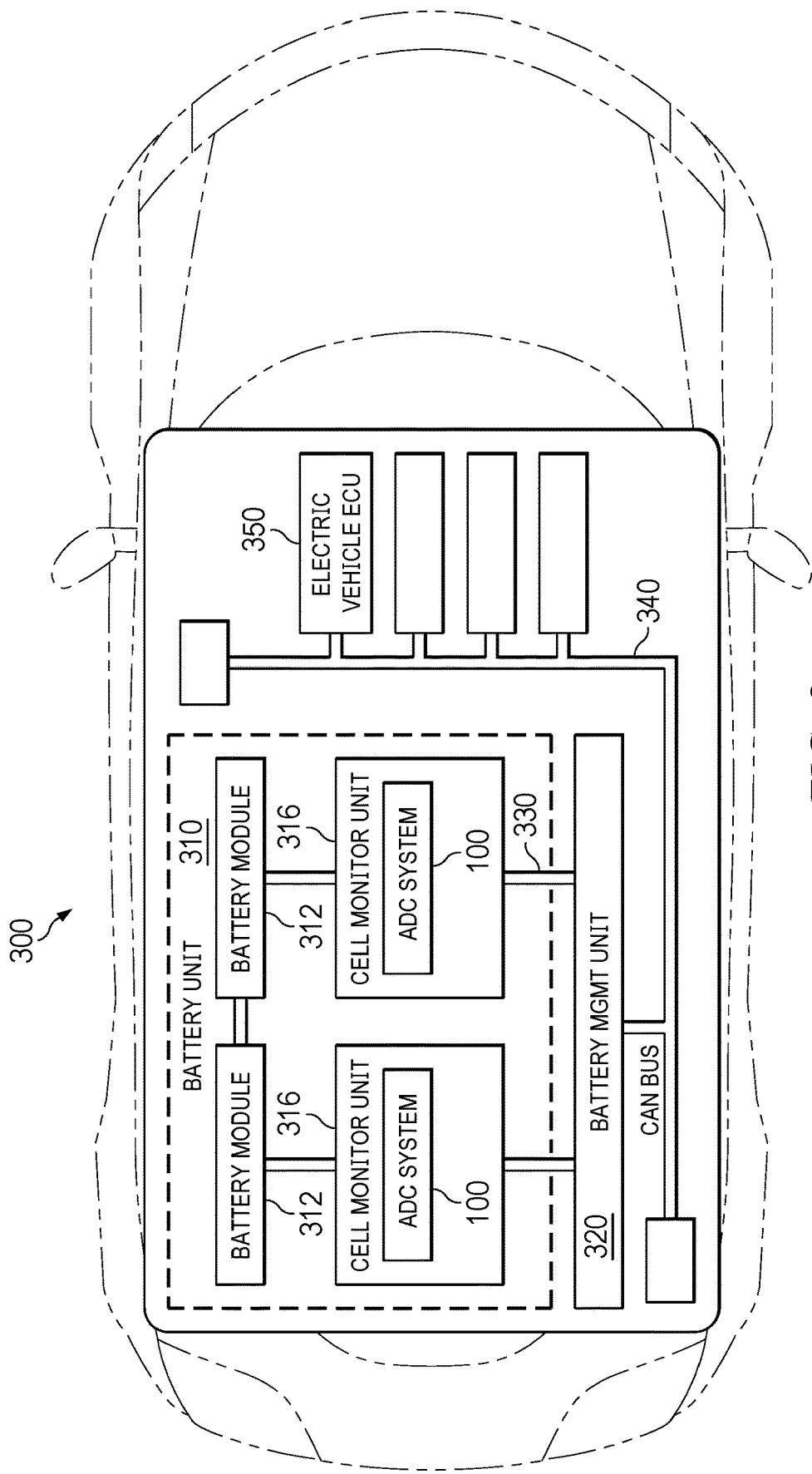
FIG. 3 is a block diagram of a vehicle in which the analog-to-digital conversion can may be employed, in accordance with an example.

FIG. 3 is a block diagram of a use-case for the analog-to-digital conversion system 100 described herein. FIG. 3 illustrates a block diagram 300 of an electric vehicle that includes a battery unit 310. The battery unit 310 includes one or more battery modules 312. Each battery module 312 includes one or battery cells. A cell monitoring unit 316 is included as well for each battery module 312. Each cell monitoring unit 316 includes the analog-to-digital conversion system 100 described herein. The analog voltages provided to each analog-to-digital conversion system 100 may be voltages of individual battery cells within the corresponding battery module 312. A battery management unit 320 is coupled to the battery unit 310 over a controller area network (CAN) bus 330. The battery management unit 320 may read the corrected digital codes corresponding the battery cell voltages from the cell monitoring units over CAN bus 330. Any anomalous battery voltages may be reported over a CAN bus 340 to the vehicle's electronic control unit (ECU) 350, which may take corrective action (e.g., place the vehicle in a lower power mode of operation).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

In this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A method, comprising:
   converting, by an analog-to-digital converter (ADC), a first input voltage to a first digital code, the first input voltage generated from a first reference voltage;
   converting, by the ADC, a second input voltage to a second digital code, the second input voltage generated from a second reference voltage;
   calculating a calibration factor based on the first digital code, the second digital code, the first reference voltage, and the second reference voltage;
   converting, by the ADC, a third voltage to a third digital code; and
   correcting the third digital code using the calibration factor.

2. The method of claim 1, wherein the calibration factor is a first calibration factor, and the method comprises calculating a second calibration factor based on at least one of the first or second digital codes, and correcting the third voltage includes using the first and second calibration factors.

3. The method of claim 2, wherein correcting the third digital code includes subtracting the second calibration factor from a product of the third digital code and the first calibration factor.

4. The method of claim 2, wherein calculating the first calibration factor includes:
   calculating a gain value as a ratio of a difference in the first and second digital codes to a difference in the first and second input voltages; and
   dividing 1 by the gain value.

5. The method of claim 4, wherein calculating the second calibration factor includes:
   calculating an offset value as the difference between one of the first or second digital codes and a product of one of the first or second input voltages and the gain value; and
   calculating the ratio of the offset value to the gain value.

6. The method of claim 5, wherein correcting the third digital code includes subtracting the second calibration factor from a product of the third digital code and the first calibration factor.

7. An electrical circuit, comprising:
   a resistor divider network coupled between a first terminal and a second terminal, the resistor divider network having a first resistor divider output and a second resistor divider output;
   an analog-to-digital converter (ADC) having an analog input configured to receive first and second input voltages from the first and second resistor divider outputs, respectively, the ADC having a first reference voltage input coupled to the first terminal and a second reference voltage coupled to the second terminal;
   a microcontroller configured to:
      receive, from the ADC, a first digital code corresponding to a first input voltage from the first resistor divider output;
      receive, from the ADC, a second digital code corresponding to a second input voltage from the second resistor divider output;
      calculate a correction factor based on the first digital code, the second digital code, the first reference voltage, and the second reference voltage;
      receive a third digital code from the ADC; and
      correct the third digital code using the correction factor.

8. The electrical circuit of claim 7, wherein:
   the correction factor is a first correction factor,
   the microcontroller is configured to calculate a second correction factor based on at least one of the first or second digital codes; and
   the microcontroller is configured to correct the third digital code includes using the first and second correction factors.

9. The electrical circuit of claim 8, wherein the microcontroller is configured to correct the third digital code by subtracting the second correction factor from a product of the third digital code and the first correction factor.

10. The electrical circuit of claim 8, wherein the microcontroller is configured to calculate the first correction factor by:
    calculating a gain value as a ratio of a difference in the first and second digital codes to a difference in the first and second input voltages; and
    dividing 1 by the gain value.

11. The electrical circuit of claim 10, wherein the microcontroller is configured to calculate the second correction factor by:
    calculating an offset value as the difference between one of the first or second digital codes and a product of one of the first or second input voltages and the gain value; and
    calculating the ratio of the offset value to the gain value.

12. The electrical circuit of claim 11, wherein the microcontroller is configured to correct the third digital code by subtracting the second correction factor from a product of the third digital code and the first correction factor.

13. The electrical circuit of claim 7, further comprising:
a multiplexer having multiplexer inputs, a multiplexer output, one of the multiplexer inputs coupled to the first resistor divider output and another of the multiplexer inputs coupled to the second resistor divider output; and
an analog front-end coupled between the multiplexer output and the analog input of the ADC.

14. The electrical circuit of claim 7, wherein the resistor divider network, multiplexer, ADC, and microcontroller are fabricated on a common semiconductor die.

15. A circuitry, comprising:
a resistor divider network coupled between a first terminal and a second terminal, the resistor divider network having a first resistor divider output and a second resistor divider output;
a multiplexer having multiplexer inputs, a multiplexer output, and a selection input, one of the multiplexer inputs coupled to the first resistor divider output and another of the multiplexer inputs coupled to the second resistor divider output;
an analog-to-digital converter (ADC) having an analog input coupled to the multiplexer output, the ADC having a reference voltage input coupled to the first terminal; and
a microcontroller having a control output coupled to the selection input, the microcontroller configured to:
receive, from the ADC, a first digital code corresponding to a first input voltage from the first resistor divider output;
receive, from the ADC, a second digital code corresponding to a second input voltage from the second resistor divider output;
calculate a calibration factor based on the first digital code, the second digital code, the first input voltage, and the second input voltage;
receive additional digital codes from the ADC; and
correct each of the additional digital codes using the calibration factor.

16. The circuitry of claim 15, wherein:
the calibration factor is a first calibration factor;
the microcontroller is configured to calculate a second calibration factor based on at least one of the first or second digital codes; and
the microcontroller is configured to correct each of the additional digital codes using the first and second calibration factors.

17. The circuitry of claim 16, wherein the microcontroller is configured to correct each of the additional digital codes by subtracting the second calibration factor from a product of each additional digital code and the first calibration factor.

18. The circuitry of claim 16, wherein the microcontroller is configured to calculate the first calibration factor by:
calculating a gain value as a ratio of a difference in the first and second digital codes to a difference in the first and second input voltages; and
dividing 1 by the gain value.

19. The circuitry of claim 18, wherein the microcontroller is configured to calculate the second calibration factor by:
calculating an offset value as the difference between one of the first or second digital codes and a product of one of the first or second input voltages and the gain value; and
calculating the ratio of the offset value to the gain value.

20. The circuitry of claim 19, wherein the microcontroller is configured to correct each of the additional digital codes by subtracting the second calibration factor from a product of each such additional digital code and the first calibration factor.

* * * * *